(12) United States Patent
Yen

(10) Patent No.: US 6,741,498 B2
(45) Date of Patent: May 25, 2004

(54) NON-VOLATILE MEMORY WITH COMMON SOURCE

(75) Inventor: Ching-Fang Yen, Taipei Hsien (TW)

(73) Assignee: Macronix International Co., Ltd., Hsin-Chu (TW)

( * ) Notice: Subject to any disclaimer, the term of this patent is extended or adjusted under 35 U.S.C. 154(b) by 0 days.

(21) Appl. No.: 10/064,216

(22) Filed: Jun. 21, 2002

(65) Prior Publication Data

US 2003/0031051 A1 Feb. 13, 2003

(30) Foreign Application Priority Data

Aug. 10, 2001 (TW) ........................................ 90119695 A

(51) Int. Cl.[7] .............................................. G11C 16/06
(52) U.S. Cl. ............... 365/185.09; 365/63; 365/185.05; 365/185.16
(58) Field of Search ..................... 365/185.09, 185.05, 365/185.16, 63

(56) References Cited

U.S. PATENT DOCUMENTS 5,450,360 A * 9/1995 Sato ............................ 365/200
6,134,142 A * 10/2000 Hirano ................... 365/185.09

* cited by examiner

*Primary Examiner*—Hoai Ho
(74) *Attorney, Agent, or Firm*—Winston Hsu

(57) ABSTRACT

A non-volatile memory that combines a main memory array region and a redundant memory array region. The non-volatile memory is constructed without the use of the field oxide and dummy memories that typically separate the main and redundant memory array regions. Instead, the main memory and redundant memory are directly adjacent to each other on a doped region of the semiconductor wafer, and the bordering memory modules share a common source, drain, bit line, and ground line. A control method is used to allow the main memory decoder and redundant memory controller to pass signals and select between the main and redundant memory array areas.

21 Claims, 12 Drawing Sheets

NON-VOLATILE MEMORY WITH COMMON SOURCE

BACKGROUND OF INVENTION

1. Field of the Invention

The present invention relates to a non-volatile memory, and more particularly, to a non-volatile memory that combines a main memory array region and a redundant memory array region.

2. Description of the Prior Art

Non-volatile memory presently includes a redundant memory array region adjacent to a conventional main memory array region. The redundant memory array region has the same structure as the main memory array region and is used to replace memory cells that have failed in the main memory array region. This design feature of non-volatile memory enhances defect tolerance during the manufacturing process and results in increased yield and memory size.

Please refer to FIG. 1. FIG. 1 is a block diagram of a conventional non-volatile memory 10. The non-volatile memory 10 is positioned on a substrate (not shown) of a semiconductor wafer. The non-volatile memory 10 comprises a peripheral circuit region 20 and a memory array region 50. The memory array region 50 comprises a main memory array region 60 and a redundant memory array region 80. The peripheral circuit region 20 comprises an address buffer 22, an addressable memory unit 24 used for storing address data of failed memory cells in the main memory array region 60, a main memory ground line decoder 26 electrically connected to a plurality of ground lines GL in the main memory array region 60, a main memory bit line decoder 27, a redundant memory ground line decoder 28 electrically connected to a plurality of ground lines RGL in the redundant memory array region 80, and a redundant memory bit line decoder 29. Each bit line BL, RBL is electrically connected to a pass transistor. The main memory bit line decoder 27 is electrically connected to a gate of the pass transistor, and the redundant memory bit line decoder 29 is also electrically connected to a gate of the pass transistor to electrically connect each bit line BL, RBL to a data line.

Please refer to FIG. 2A and FIG. 2B. FIG. 2A is a structural schematic diagram of a memory array region 50 in a conventional non-volatile memory 10, and FIG. 2B is a circuit diagram of a memory array region 50 in a conventional non-volatile memory 10. The non-volatile memory 10 is positioned on a substrate 42 of a semiconductor wafer 40. The memory array region 50 comprises a main memory array region 60, a redundant memory array region 80, a field oxide 70 positioned between the main memory array region 60 and the redundant memory array region 80 and used to divide the main memory array region 60 from the redundant memory array region 80, and two dummy memories 72 positioned on each side of the field oxide 70 that are used to prevent the main memory array region 60 and the redundant memory array region 80 from being affected by the field oxide 70 during the fabrication process.

The main memory array region 60 comprises M bit lines $BL_1$ to $BL_M$, M+1 ground lines $GL_1$ to $GL_{M+1}$, and a plurality of memory cells. Each memory cell comprises a source 56 and a drain 54 positioned in the substrate 42 of the semiconductor wafer 40, and a gate 58 positioned on the substrate 42. Each ground line GL is electrically connected to the sources 56 of a predetermined number of memory cells, and each bit line BL is electrically connected to the drains 546 of a predetermined number of memory cells in the main memory array region 60. Among M+1 ground lines, $GL_2$ to $GL_M$ are used for operating the memory cells on either side of the ground line. That is, ground lines $GL_2$ to $GL_M$ are shared by the memory cells positioned on either side of the respective ground line, and ground lines $GL_1$ and $GL_{M+1}$ are used for operating memory cells on only one side of the ground line. Additionally, $BL_1$ to $BL_M$ are used for operating the memory cells on either side of the bit line. That is, bit lines $BL_1$ to $BL_M$ are shared by the memory cells positioned on either side of the respective bit line.

The redundant memory array region 80 comprises N bit lines $RBL_1$ to $RBL_N$, N+1 ground lines $RGL_1$ to $RGL_{N+1}$, and a plurality of memory cells. Each memory cell comprises a source 56 and a drain 54 positioned in the substrate 42 of the semiconductor wafer 40, and a gate 58 positioned on the substrate 42. Each ground line RGL is electrically connected to the sources 56 of a predetermined number of memory cells in the redundant memory array region 80, and each bit line RBL is electrically connected to the drains 54 of a predetermined number of memory cells in the redundant memory array region 80. Among the N+1 ground lines, $RGL_2$ to $RGL_N$ are used for operating the memory cells on either side of the ground line. That is, ground lines $RGL_2$ to $RGL_N$ are shared by the memory cells positioned either side of the respective ground line, and ground lines $RGL_1$ and $RGL_{N+1}$ are used for operating the memory cells on only one side of the ground line. Additionally, $RBL_1$ to $RBL_N$ are used for operating the memory cells on either side of the bit line. That is, bit lines $RBL_1$ to $RBL_N$ are shared by the memory cells positioned on either side of the respective bit line.

Please refer to FIG. 2B. When a memory cell M2 in the non-volatile memory 10 is accessed, it is necessary to address a ground line $GL_2$, a bit line $BL_1$, and a word line $WL_1$ to control a source 56, a drain 54, and a gate 58, respectively. The address buffer 22 passes an address signal to the addressable memory unit 24, the main memory ground line decoder 26, the main memory bit line decoder 27, the redundant memory ground line decoder 28, and the redundant memory bit line decoder 29. The main memory ground line decoder 26 decodes the address signal to address the ground line $GL_2$. The main memory bit line decoder 27 decodes the address signal to turn on each pass gate to address the bit line $BL_1$. Addressing the word line $WL_1$ is performed in the same manner.

When the address signal corresponds with an address stored in the addressable memory unit 24, the addressable memory unit 24 generates a corresponding signal to turn on the redundant memory ground line decoder 28 and the redundant memory bit line decoder 29. The redundant memory ground line decoder 28 decodes the address signal passed from the address buffer 22 to address a redundant ground line. The redundant memory bit line decoder 29 decodes the address signal passed from the address buffer 22 to turn on each pass gate to address a redundant bit line.

In the conventional memory array region 50 of a non-volatile memory 10, the field oxide 70 positioned between the main memory array region 60 and the redundant memory array region 80 and the two dummy memories 72 positioned on each side of the field oxide 70 are utilized to divide the main memory array region 60 from the redundant memory array region 80. However, the field oxide 70 and the dummy memories 72, which are incapable of storing data, increase the layout area of the memory array region 50. Therefore, as the design dimensions of semiconductor products continue to shrink, it becomes increasingly important to reduce the area taken up by the field oxide 70 and the dummy memories 72 in order to increase the usable area of the memory array region.

SUMMARY OF INVENTION

It is therefore a primary objective of the claimed invention to provide a non-volatile memory with a combined main memory array region and redundant memory array region to solve the above-mentioned problem of the prior art.

The claimed invention provides a non-volatile memory without the field oxide and the dummy memory that are used to divide the main memory array region from the redundant memory array region. Moreover, the non-volatile memory has the main memory array region directly connected to the redundant memory array region. Furthermore, the non-volatile memory has a virtual ground array structure. Both the main memory array region and the redundant memory array region comprise a plurality of memory cells, a plurality of bit lines, and a plurality of ground lines. Each memory cell comprises a common source and a common drain positioned in a substrate of a semiconductor wafer. Each bit line is electrically connected to the drains of a predetermined number of memory cells in the main memory array region or the redundant memory array region, and each ground line is electrically connected to the sources of a predetermined number of memory cells in the main memory array region or the redundant memory array region.

The non-volatile memory according to the claimed invention utilizes a main memory decoder and a redundant memory decoder to connect the main memory array region to the redundant memory array region through a common source (or drain). That is to say, the ground line (or the bit line) on the border of the main memory array region is capable of combining with the ground line (or the bit line) on the border of the redundant memory array region to form a common ground line (or a common bit line) electrically connected to the common source (or drain). Thus the main memory array region is directly adjacent to the redundant memory array region.

The non-volatile memory according to the claimed invention utilizes a main memory decoder and a redundant memory decoder to enable the main memory array region to be placed directly adjacent to the redundant memory array region. It is an advantage of the present invention that the field oxide and the dummy memory used for dividing the main memory array region from the redundant memory array region is unnecessary, which reduces the layout area of the memory array region.

These and other objectives of the claimed invention will no doubt become obvious to those of ordinary skill in the art after having read the following detailed description of the preferred embodiment that is illustrated in the various figures and drawings.

DETAILED DESCRIPTION

Figure 1:
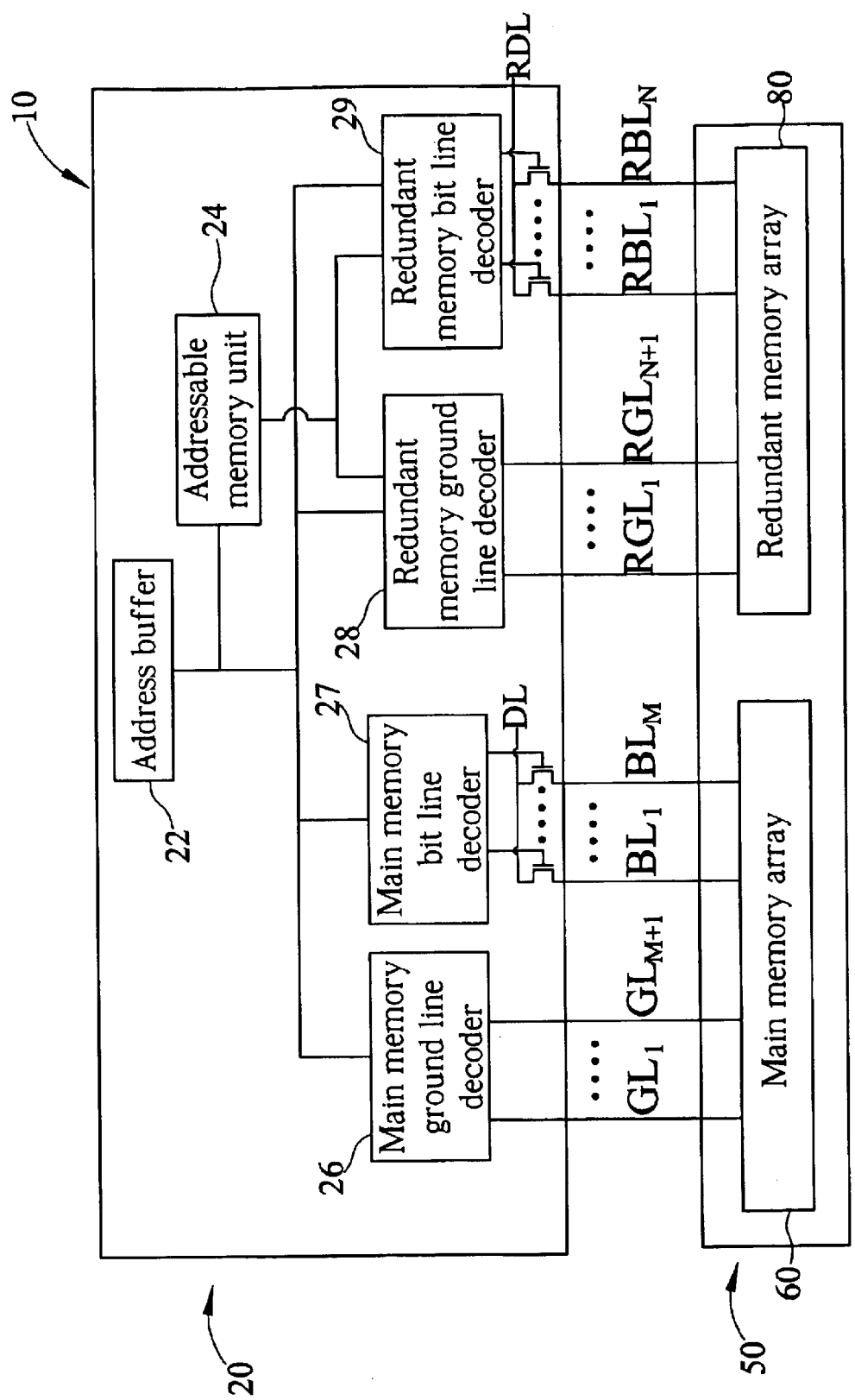
FIG. 1 is a block diagram of a conventional non-volatile memory.
Figure 2A:
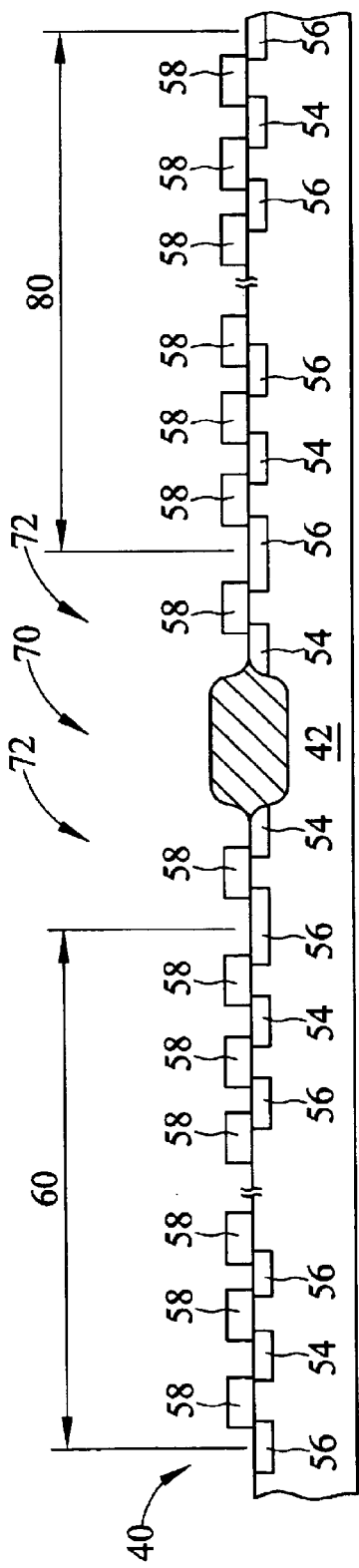
FIG. 2A is a structural schematic diagram of a memory array region in a conventional non-volatile memory.
Figure 2B:
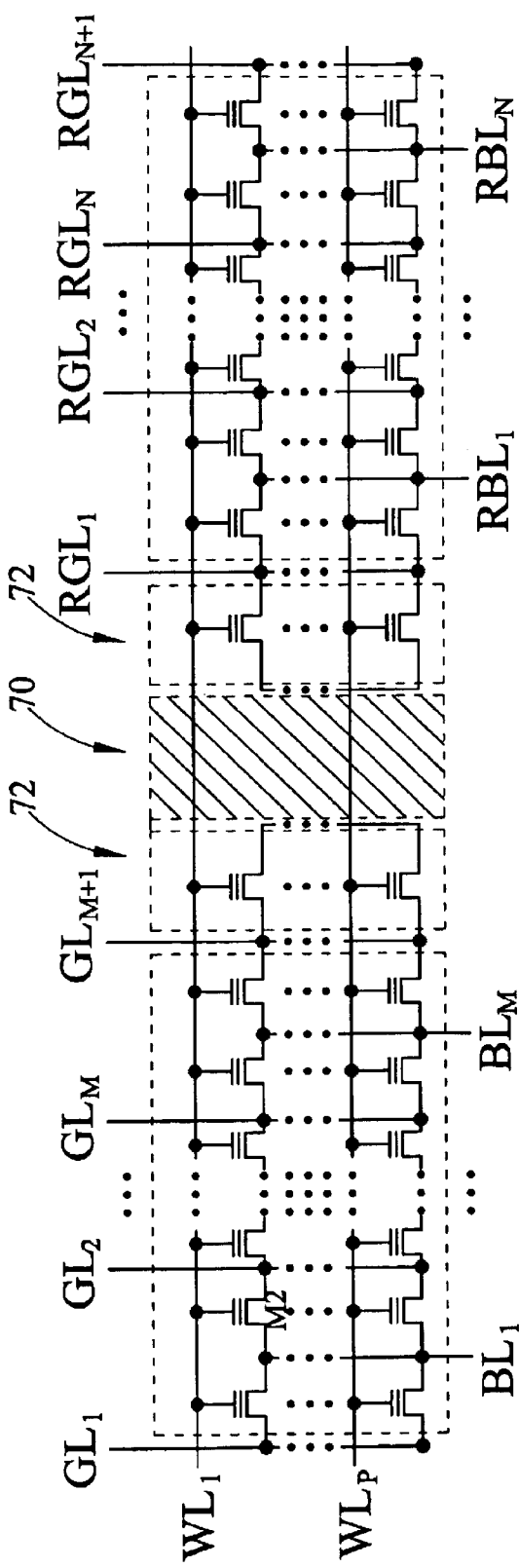
FIG. 2B is a circuit diagram of a memory array region in a conventional non-volatile memory.
Figure 3:
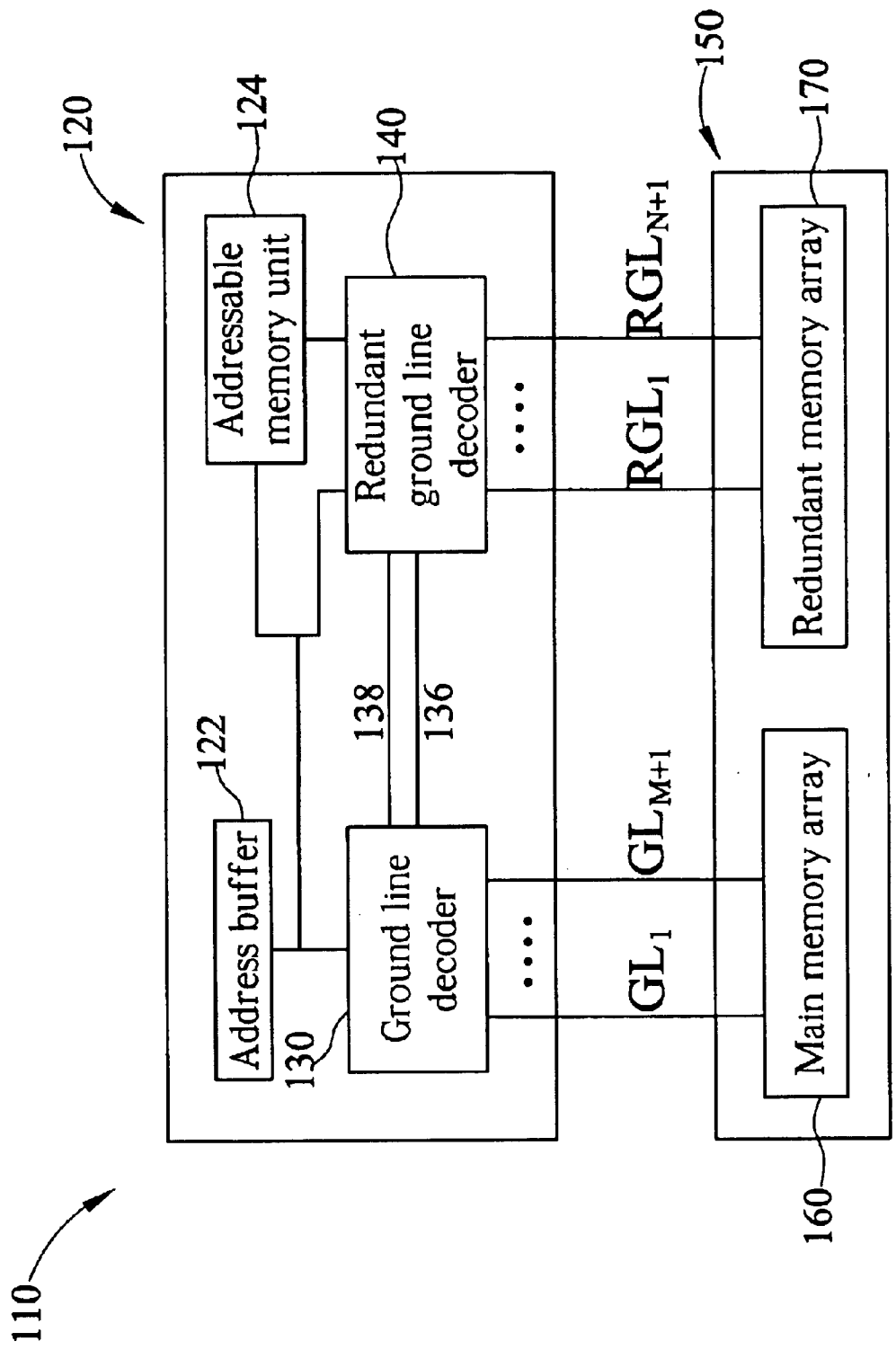
FIG. 3 is a partial block diagram of a non-volatile memory according to the present invention.

Please refer to FIG. 3. FIG. 3 is a partial block diagram of a non-volatile memory 110 according to the present invention. The non-volatile memory 110 comprises a peripheral circuit region 120 and a memory array region 150. Those portions of the memory circuit 110 pertaining to bit lines are not shown in FIG. 3. The memory array region 150 comprises a main memory array region 160 and a redundant memory array region 170. The peripheral circuit region 120 comprises an address buffer 122, an addressable memory unit 124 used for storing address data of failed memory cells in the main memory array region 160, a ground line decoder 130 electrically connected to ground lines GL in the main memory array region 160, and a redundant ground line decoder 140 electrically connected to ground lines RGL in the redundant memory array region 170.

Figure 4:
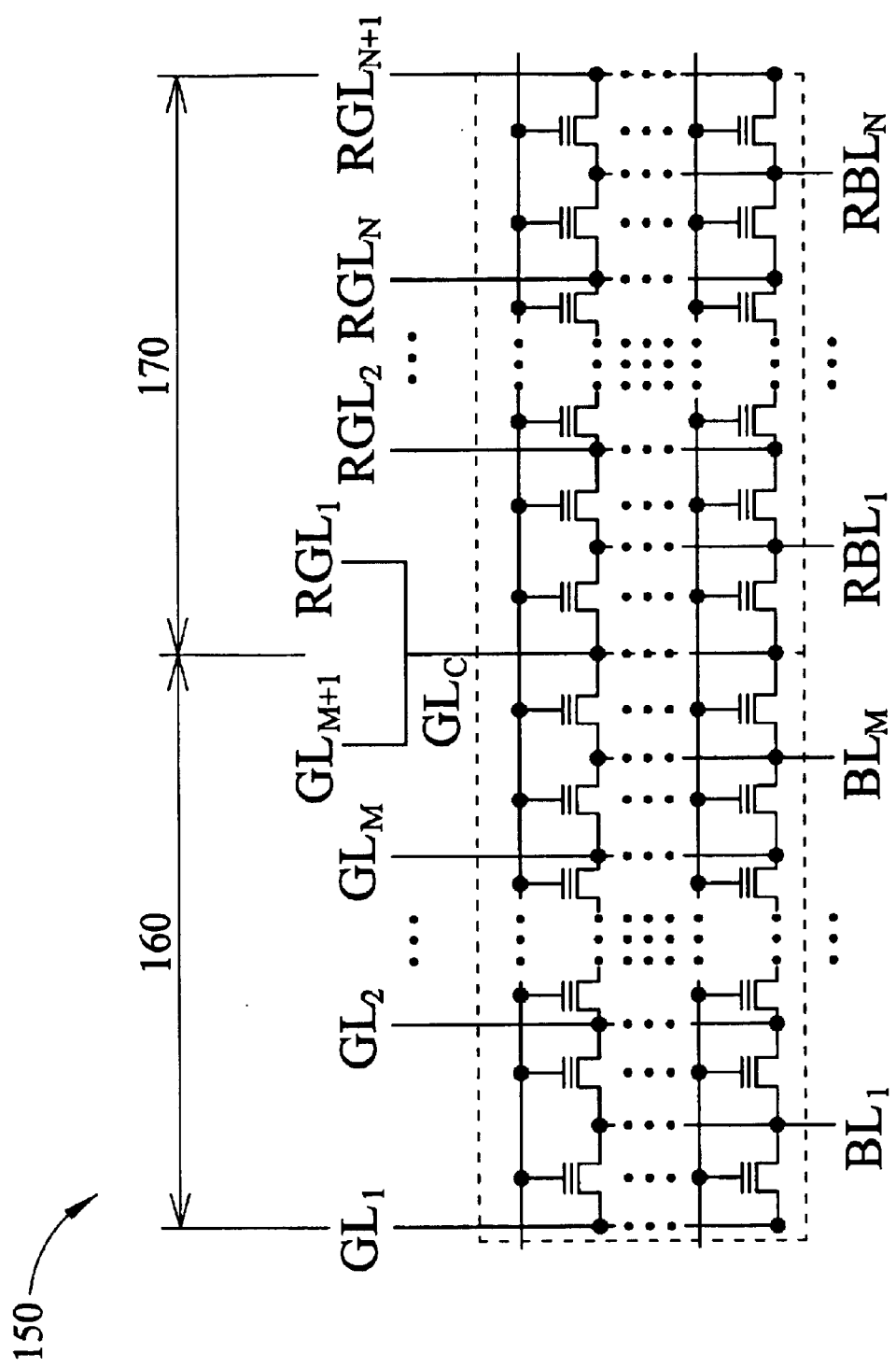
FIG. 4 is a circuit diagram of a memory array region in a non-volatile memory according to the present invention.
Figure 5:
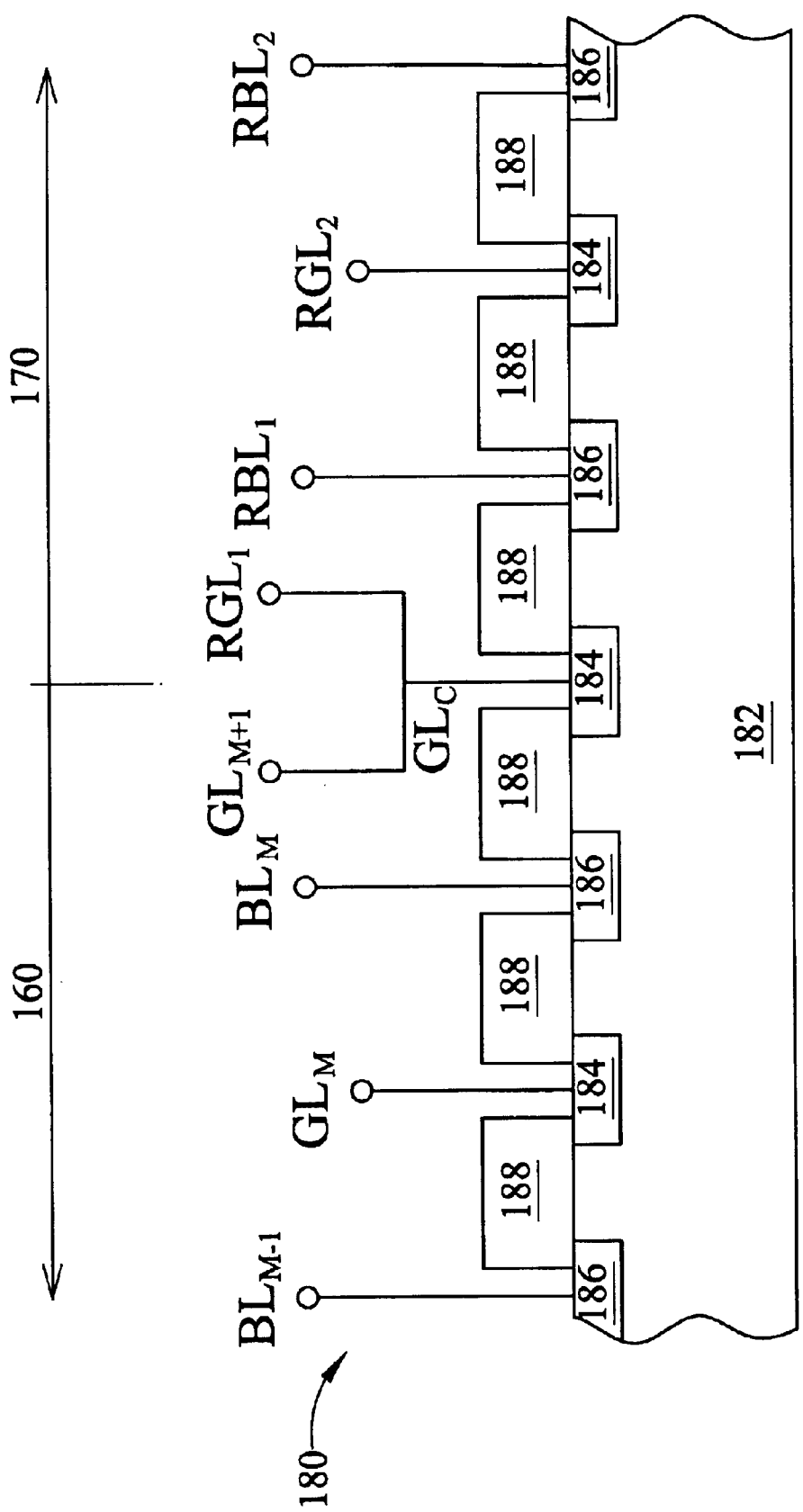
FIG. 5 is a structural diagram of a memory array region in a non-volatile memory according to the present invention.

Please refer to FIG. 4 and FIG. 5. FIG. 4 is a circuit diagram of the memory array region 150 in the non-volatile memory 110 according to the present invention. FIG. 5 is a structural diagram of the memory array region 150. The non-volatile memory 110 is positioned on a substrate 182 of a semiconductor wafer 180. The memory array region 150 comprises the main memory array region 160 and the redundant memory array region 170. The main memory array region 160 directly connects to the redundant memory array region 170, and a ground line $GL_{M+1}$ on the border of the main memory array region 160 is combined with a ground line $RGL_1$ on the border of the redundant memory array region 170 to form a common ground line $GL_C$. That is, the main source and the redundant source on the border of the main memory array region 160 and the redundant memory array region 170 is a common doped region.

The main memory array region 160 comprises M bit lines $BL_1$ to $BL_M$, M+1 ground lines $GL_1$ to $GL_{M+1}$, and a plurality of memory cells. Each memory cell comprises a source 184 and a drain 186 positioned in the substrate 182 of the semiconductor wafer 180, and a gate 188 positioned on the substrate 182. The gate 188 may be a control gate or a floating gate. Each ground line GL is electrically connected to the sources 184 of a predetermined number of memory cells in the main memory array region 160, and each bit line BL is electrically connected to the drains 186 of a predetermined number of memory cells in the main memory array region 160. Among the M+1 ground lines, $GL_2$ to $GL_{M+1}$ are used to operate those memory cells that are positioned on either side of the ground line. That is, ground lines $GL_2$ to $GL_{M+1}$ are shared by the memory cells that are positioned on both sides of the respective ground lines. Ground line $GL_1$ is used to operate the memory cell on only one side of the ground line $GL_1$, since ground line $GL_1$ is located along the farthest edge of the main memory array region 160 and only borders one memory cell.

The redundant memory array region 170 comprises N bit lines $RBL_1$ to $RBL_N$, N+1 ground lines $RGL_1$ to $RGL_{N+1}$, and a plurality of memory cells. Each memory cell comprises a source 184 and a drain 186 positioned in the substrate 182 of the semiconductor wafer 180, and a gate 188 positioned on the substrate 182. Each ground line RGL is electrically connected to the sources 184 of a predetermined number of memory cells in the redundant memory array region 170, and each bit line RBL is electrically connected to the drains 186 of a predetermined number of memory cells in the redundant memory array region 170. Among the N+1 ground lines, $RGL_1$ to $RGL_N$ are used to operate the memory cells on either side of the respective ground line. That is, ground lines $RGL_1$ to $RGL_N$ are shared by the memory cells positioned on both sides of the respective ground lines. Ground line $RGL_{N+1}$ is used to operate a memory cell on only one side of the ground line $RGL_{N+1}$, since ground line $RGL_{N+1}$ is located along the farthest edge of the redundant memory array region 170 and only borders one memory cell.

Figure 6A:
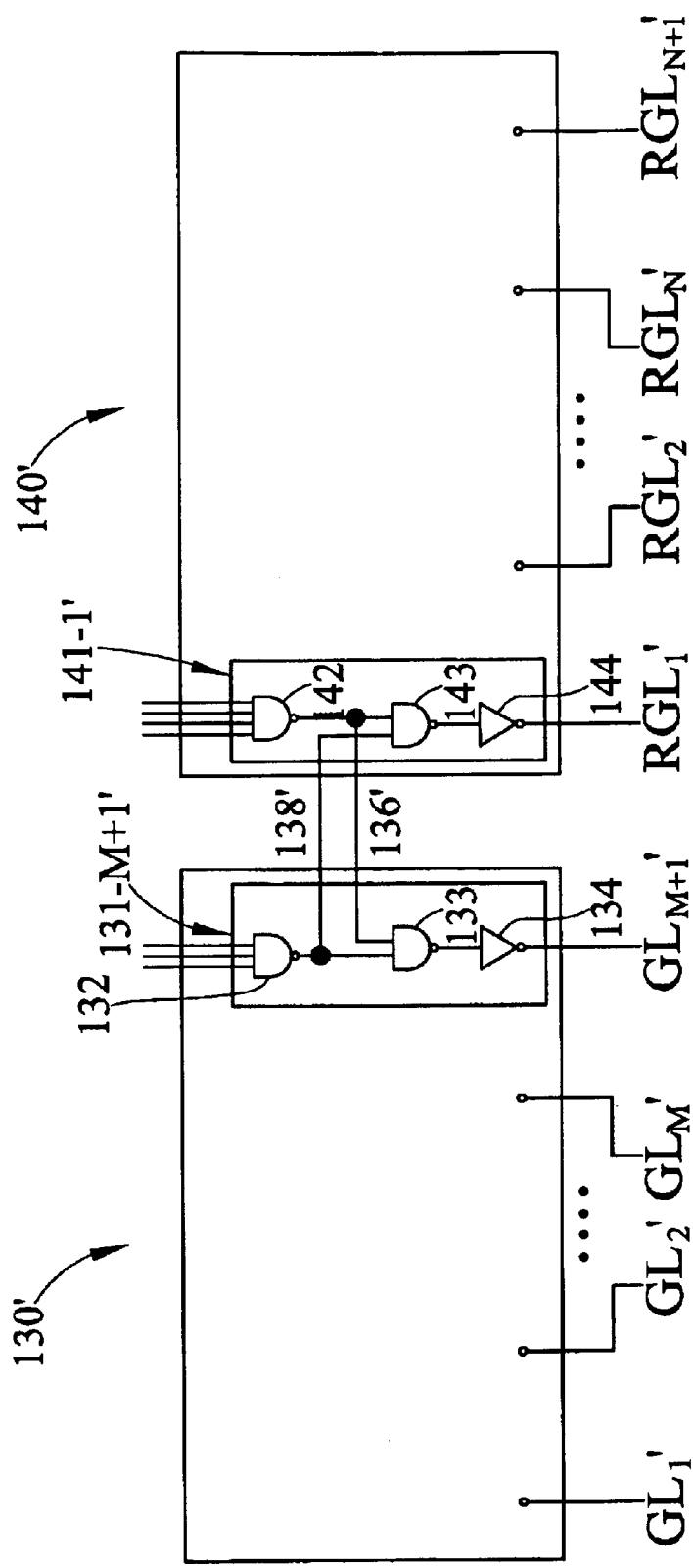
FIG. 6A is a logic circuit diagram of a ground line decoder and a redundant ground line decoder according to a preferred embodiment of the present invention.

Please refer to FIG. 6A. FIG. 6A is a logic circuit diagram of a ground line decoder 130' and a redundant ground line decoder 140' according to a preferred embodiment of the present invention. The ground line decoder 130' comprises M+1 ground line sub-decoders $131\text{-}_1'$ to $131\text{-}_{M+1}'$, and each ground line sub-decoder 131' corresponds to a ground line GL' in the main memory array region 160. Except for the ground line sub-decoders $131\text{-}_1'$ and $131\text{-}_{M+1}'$, each ground line sub-decoder $131\text{-}_2'$ to $131\text{-}_{M}'$ comprises two three-input NAND gates used for receiving an address signal, a two-input NAND gate whose two inputs are electrically connected to two outputs of the three-input NAND gates, and an inverter whose input is electrically connected to an output of the two-input NAND gate. The ground line sub-decoder $131\text{-}_{M+1}'$ corresponding to the ground line $GL_{M+1}'$ comprises a three-input NAND gate 132 used for receiving an address signal, a two-input NAND gate 133, and an inverter 134. One input of the two-input NAND gate 133 is electrically connected to an output of the three-input NAND gate 132, and the other input is electrically connected to a signal pass line 136'. An input of the inverter 134 is electrically connected to an output of the two-input NAND gate 133.

The redundant ground line decoder 140' comprises N+1 redundant ground line sub-decoders $141\text{-}_1'$ to $141\text{-}_{N+1}'$, and each redundant ground line sub-decoder 141' corresponds to a ground line RGL' in the redundant memory array region 170. Except for the redundant ground line sub-decoders $141\text{-}_1'$ and $141\text{-}_{N+1}'$, each redundant ground line sub-decoder $141\text{-}_2'$ to $141\text{-}_{M}'$ comprises two four-input NAND gates used for receiving an address signal and a corresponding signal, a two-input NAND gate whose two inputs are electrically connected to two outputs of the four-input NAND gates, and an inverter whose input is electrically connected to an output of the two-input NAND gate. The redundant ground line sub-decoder $141\text{-}_1'$ corresponding to the ground line $RGL_1'$ comprises a four-input NAND gate 142 used for receiving an address signal and a corresponding signal, a two-input NAND gate 143, and an inverter 144. One input of the two-input NAND gate 143 is electrically connected to an output of the four-input NAND gate 142, and the other input is electrically connected to a signal pass line 138'. An input of the inverter 144 is electrically connected to an output of the two-input NAND gate 143.

Two ends of the signal pass line 136' are electrically connected to an input of the two-input NAND gate 133 of the ground line sub-decoder $131\text{-}_{M+1}'$ and an output of the four-input NAND gate 142 of the redundant ground line sub-decoder $141\text{-}_1'$, respectively. Two ends of the signal pass line 138' are electrically connected to an input of the two-input NAND gate 143 of the redundant ground line sub-decoder $141\text{-}_1'$ and an output of the three-input NAND gate 132 of the ground line sub-decoder $131\text{-}_{M+1}'$, respectively.

When the non-volatile memory 110 is operated, the address buffer 122 passes an address signal to the ground line decoder 130' and the addressable memory unit 124, respectively. The ground line decoder 130' decodes the address signal and the signal of the signal pass line 136' to select an appropriate ground line GL' in the main memory array region 160. When the address signal passed corresponds to an address stored in the addressable memory unit 124, the addressable memory unit 124 generates a corresponding signal to turn on the redundant ground line decoder 140'. The redundant ground line decoder 140' decodes the address signal and the signal of the signal pass line 138' to select an appropriate redundant ground line RGL' in the redundant memory array region 170.

For instance, when the ground line decoder 130' attempts to turn on the common art ground line $GL_C'$, the output $CL_{M+1}'$ of the ground line sub-decoder $131\text{-}_{M+1}'$ is selected, and the signal pass line 138' of the ground line sub-decoder $131\text{-}_{M+1}'$ passes an interacting signal to the redundant ground line sub-decoder $141\text{-}_1'$ to also select the output $RGL_1'$. That is to say, both the sub-decoders $131\text{-}_{M+1}'$ and $141\text{-}_1'$ are selected (i.e. both sub-decoders generate an equal potential output). Likewise, when the redundant ground line decoder 140' attempts to turn on the common ground line $GL_C'$, the output $RGL_1'$ of the redundant ground line sub-decoder $141\text{-}_1'$ is selected, and the signal pass line 136' of the redundant ground line sub-decoder $141\text{-}_1'$ passes an interacting signal to the ground line sub-decoder $131\text{-}_{M+1}'$ to also select the output $GL_{M+1}'$. That is to say, both the sub-decoders $131\text{-}_{M+1}'$ and $141\text{-}_1'$ are selected (i.e. both sub-decoders generate an equal potential output).

Figure 6B:
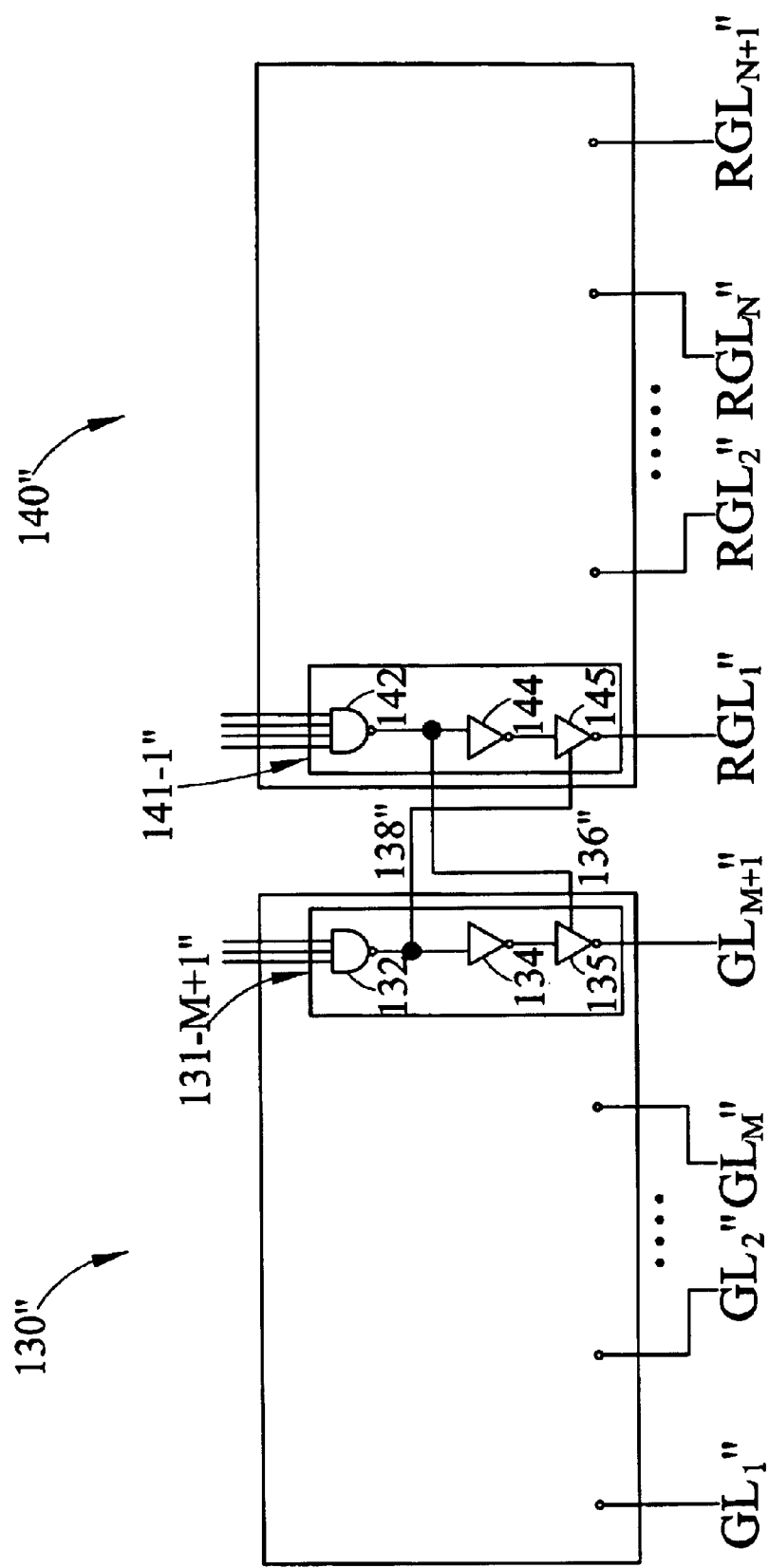
FIG. 6B is a logic circuit diagram of a ground line decoder and a redundant ground line decoder according to another preferred embodiment of the present invention.

Please refer to FIG. 6B. FIG. 6B is a logic circuit diagram of a ground line decoder 130" and a redundant ground line decoder 140" according to another preferred embodiment of the present invention. A ground line sub-decoder $131\text{-}_{M+1}"$ corresponding to a ground line $GL_{M+1}"$ comprises a three-input NAND gate 132 used for receiving an address signal, an inverter 134, and a tri-state inverter 135. An input of the inverter 134 is electrically connected to an output of the three-input NAND gate 132, an input of the tri-state inverter 135 is electrically connected to an output of the inverter 134, and a control end of the tri-state inverter 135 is connected to a signal pass line 136".

The redundant ground line sub-decoder $141\text{-}_1"$ comprises a four-input NAND gate 142 used for receiving an address signal and a corresponding signal, an inverter 144, and a tri-state inverter 145, wherein an input of the inverter 144 is electrically connected to an output of the four-input NAND gate 142, an input of the tri-state inverter 145 is electrically connected to an output of the inverter 144, and a control end of the tri-state inverter 145 is electrically connected to a signal pass line 138".

Two ends of the signal pass line 136" are electrically connected to a control end of the tri-state inverter 135 of the ground line sub-decoder 131-$_{M+1}$" and an output of the four-input NAND gate 142 of the redundant ground line sub-decoder 141-$_1$", respectively. Two ends of the signal pass line 138" are electrically connected to a control end of the inverter 145 of the redundant ground line sub-decoder 141-$_1$" and and an output of the three-input NAND gate 132 of the ground line sub-decoder 131-$_{M+1}$", respectively.

As the operation procedure illustrates in FIG. 6A, when the non-volatile memory 110 is operated, the address buffer 122 passes an address signal to the ground line decoder 130" and the addressable memory unit 124, respectively. The ground line decoder 130" decodes the address signal and a signal in the signal pass line 136" to select an appropriate ground line GL" in the main memory array region 160. When the address signal passed corresponds to an address stored in the addressable memory unit 124, the addressable memory unit 124 generates a corresponding signal to turn on the redundant ground line decoder 140". The redundant ground line decoder 140" decodes the address signal and the signal of the signal pass line 138" to select an appropriate redundant ground line RGL" in the redundant memory array region 170.

For instance, when the ground line decoder 130" attempts to turn on the common ground line CL$_C$", the output CL$_{M+1}$" of the ground line sub-decoder 131-$_{M+1}$" is selected, and the signal pass line 138" of the ground line sub-decoder 131-$_{M+1}$" passes an interacting signal to the redundant ground line sub-decoder 141-$_1$" to make the output RGL$_1$" of the redundant ground line sub-decoder 141-$_1$" open-circuited and unable to operate the common ground line GL$_C$". That is to say, the potential of the common ground line GL$_C$" is determined by the output of the sub-decoders 131-$_{M+1}$". Likewise, when the redundant ground line decoder 140" attempts to turn on the common ground line GL$_C$", the output RGL$_1$" of the redundant ground line sub-decoder 141-$_1$" is selected, and the signal pass line of the redundant ground line sub-decoder 141-$_1$" passes an interacting signal to the ground line sub-decoder 131-$_{M+1}$" to make the output GL$_{M+1}$" of the ground line sub-decoder 131-$_{M+1}$" open-circuited and unable to operate the common ground line GL$_C$". In other words, the potential of the common ground line GL$_C$" is determined by the output of the sub-decoders 141-$_1$".

Figure 7:
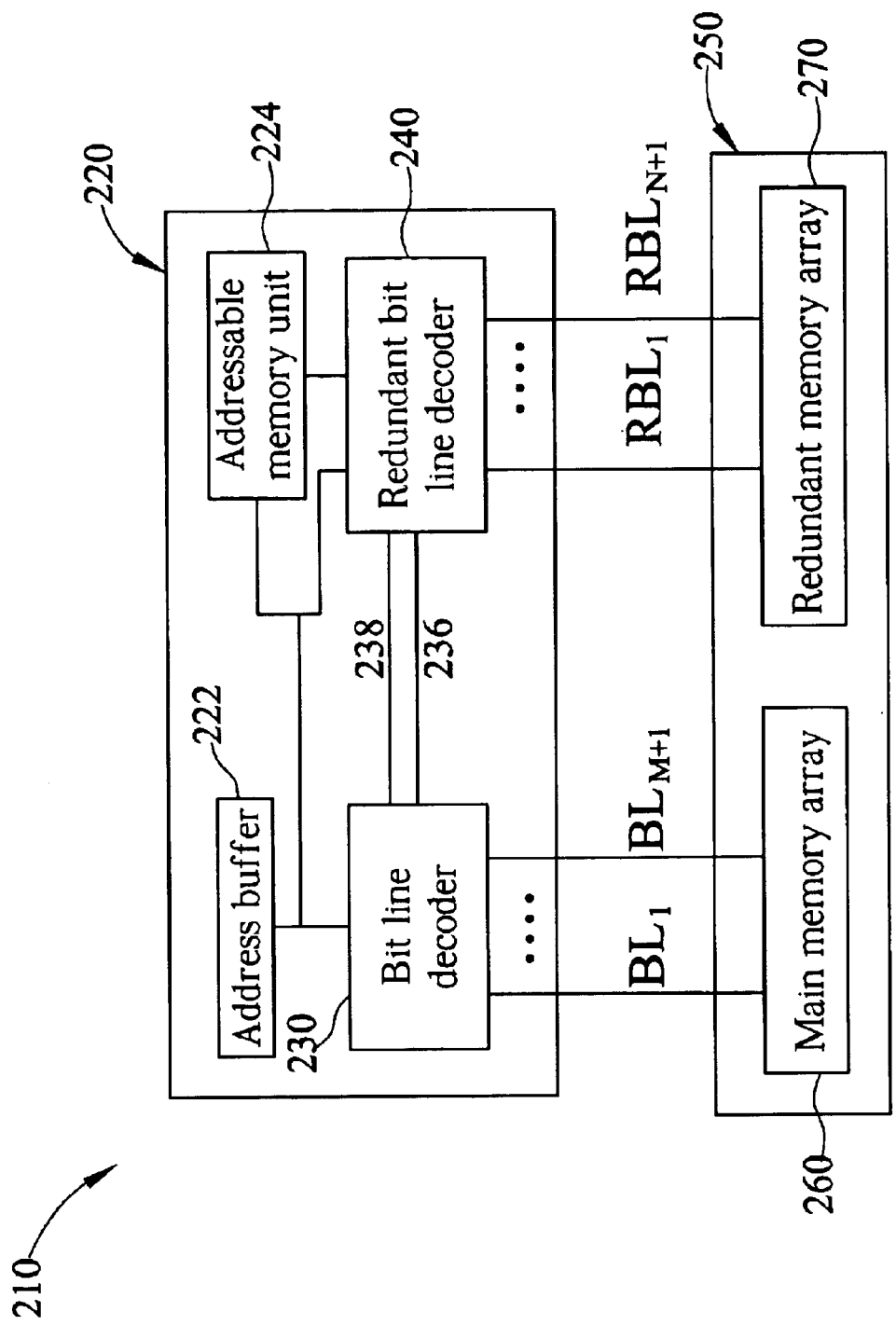
FIG. 7 is a partial block diagram of a non-volatile memory according to the present invention.

Therefore, the present invention utilizes the ground line decoder 130'/130" and the redundant ground line decoder 140'/140" to place the main memory array region 160 directly adjacent to the redundant memory array region 170. In the two embodiments mentioned above, the main memory array region 160 and the redundant memory array region 170 share a source, form a common ground line, and correctly apply each potential to the common ground line. The interactive signal passed from the signal pass line 138'/138" of the ground line decoder 130'/130" is used to control the redundant ground line decoder 140'/140", and the interactive signal passed from the signal pass line 136'/136" of the redundant ground line decoder 140'/140" is used to control the ground line decoder 130'/130". The main memory array region 160 is connected to the redundant memory array region 170 not only through a common ground line, but also through a common bit line. Please refer to FIG. 7. FIG. 7 is a partial block diagram of a non-volatile memory 210 according to the present invention. The non-volatile memory 210 comprises a peripheral circuit region 220 and a memory array region 250, wherein the portion pertaining to ground lines is not shown in FIG. 7. The memory array region 250 comprises a main memory array region 260 and a redundant memory array region 270. The peripheral circuit region 220 comprises an address buffer 222, an addressable memory unit 224 used for storing the address data of a failed memory cell in the main memory array region 260, a bit line decoder 230 electrically connected to bit lines BL in the main memory array region 260, a redundant bit line decoder 240 electrically connected to bit lines RBL in the redundant memory array region 270.

Figure 8:
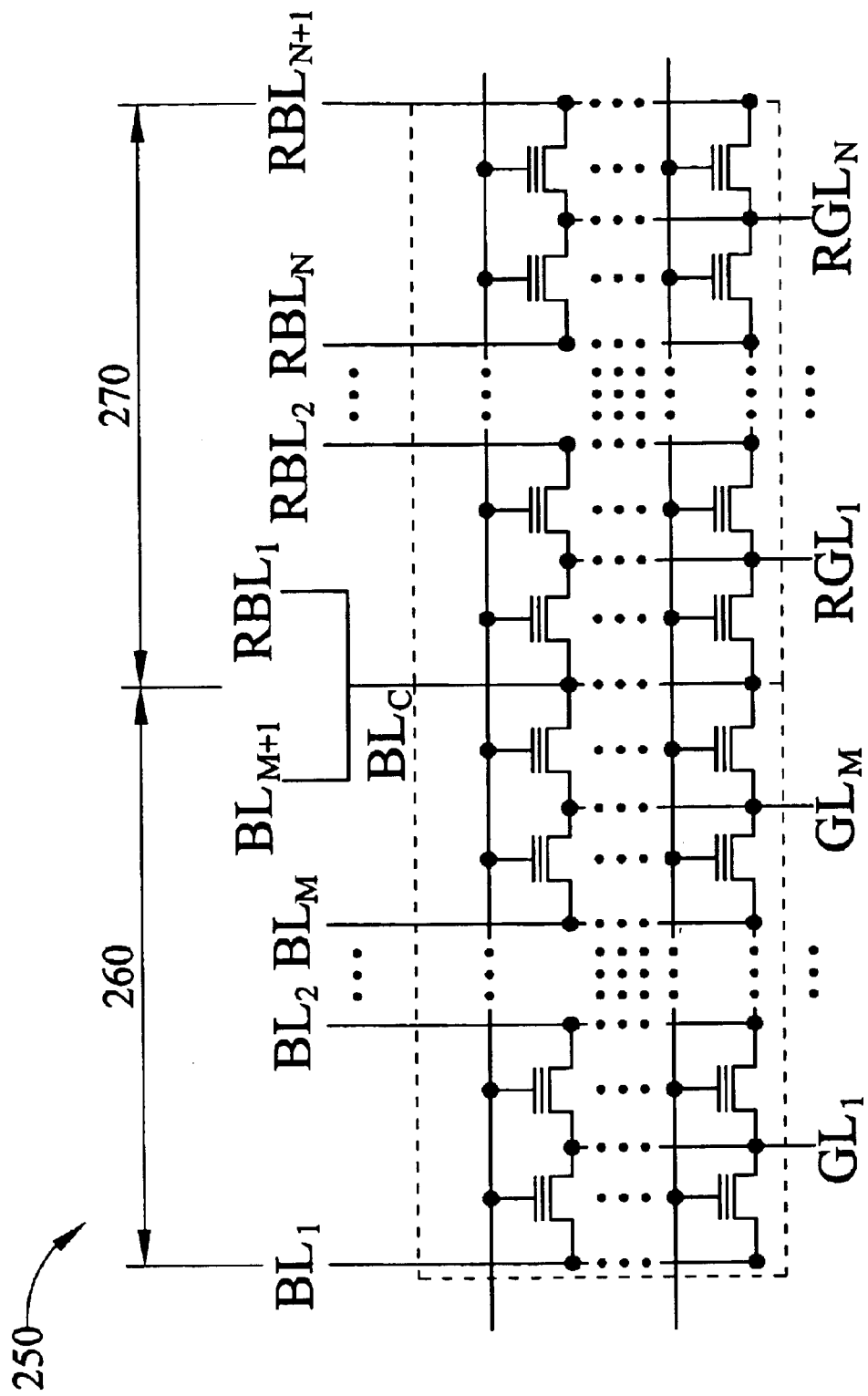
FIG. 8 is a circuit diagram of a memory array region in a non-volatile memory according to the present invention.
Figure 9:
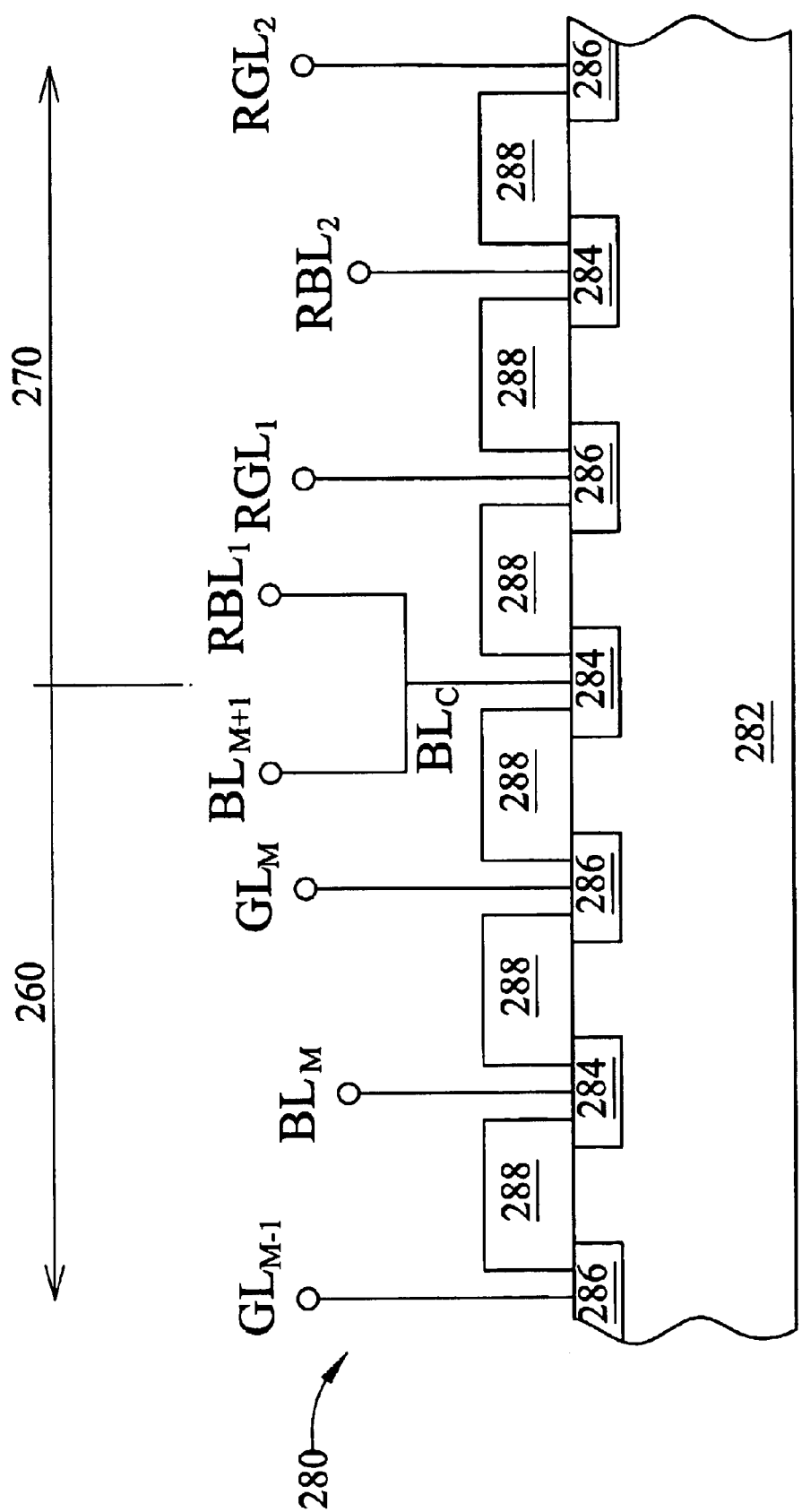
FIG. 9 is a structural diagram of a memory array region in a non-volatile memory according to the present invention.

Please refer to FIG. 8 and FIG. 9. FIG. 8 is a circuit diagram of a memory array region 250 in a non-volatile memory 210 according to the present invention, and FIG. 9 is a structural diagram of a memory array region 250 in a non-volatile memory 210 according to the present invention. The non-volatile memory 210 is positioned on a substrate 282 of a semiconductor wafer 280. The memory array region 250 comprises a main memory array region 260 and a redundant memory array region 270. The main memory array region 260 directly connects to the redundant memory array region 270, and the bit line BL$_{M+1}$ on the border of the main memory array region 260 is combined with the bit line RBL$_1$ on the border of the redundant memory array region 270 to form a common bit line BL$_C$, that is, the main drain and the redundant drain on the border of the main memory array region 260 and the redundant memory array region 270 is a common doped region.

The main memory array region 260 comprises M+1 bit lines BL$_1$ to BL$_{M+1}$, M ground lines GL$_1$ to GL$_M$, and a plurality of memory cells. Each memory cell comprises a source 286 and a drain 284 positioned in the substrate 282 of the semiconductor wafer 280, and a gate 288 positioned on the substrate 282. Each ground line GL is electrically connected to the source 286 of a predetermined number of memory cells in the main memory array region 260, and each bit line BL is electrically connected to the drains 284 of a predetermined number of memory cells the main memory array region 260. Among the M+1 bit lines, BL$_2$ to BL$_{M+1}$ are used for operating the memory cells positioned on either side, that is, bit lines BL$_2$ to BL$_{M+1}$ are shared by the memory cells positioned on both sides of the respective bit lines, and bit line BL$_1$ located at the farthest edge of the main memory array region 260 is used for operating the memory cell on only one side.

The redundant memory array region 270 comprises N+1 bit lines RBL$_1$ to RBL$_{N+1}$, N ground lines RGL$_1$ to RGL$_N$, and a plurality of memory cells. Each memory cell comprises a source 286 and a drain 284 positioned in the substrate 282 of the semiconductor wafer 280, and a gate 288 positioned on the substrate 282. Each ground line RGL is electrically connected to the source 286 of a predetermined number of memory cells in the redundant memory array region 270, and each bit line RBL is electrically connected to the drains 284 of a predetermined number of memory cells in the redundant memory array region 270. Among the N+1 bit lines, RBL$_1$ to RBL$_N$ are used for operating the memory cells on either side, that is, bit lines $RBL_1$ to $RBL_N$ are shared by the memory cells positioned on both sides of the respective bit lines, and bit line $RBL_{N+1}$ is used for operating the memory cell on only one side.

Figure 10A:
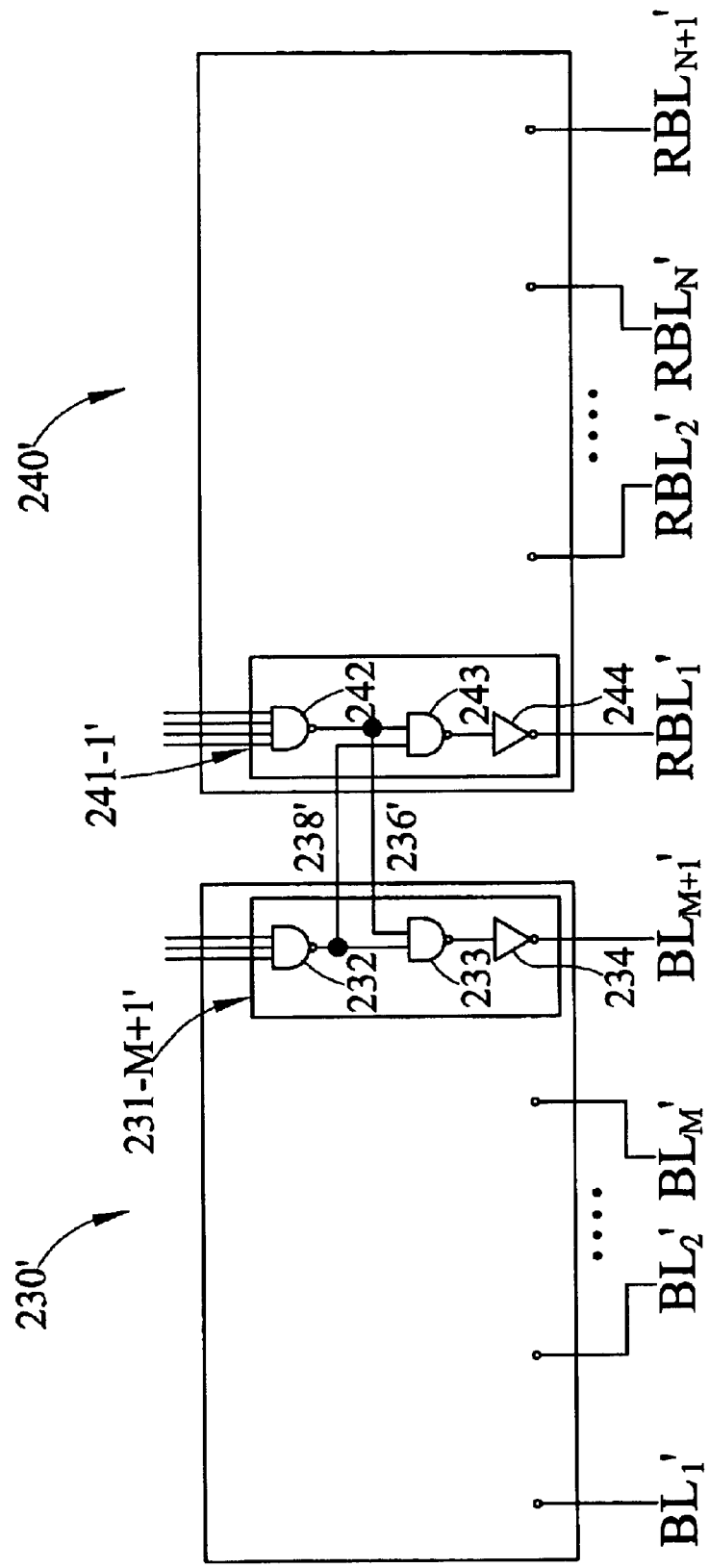
FIG. 10A is a logic circuit diagram of a bit line decoder and a redundant bit line decoder according to the present invention.

Please refer to FIG. 10A. FIG. 10A is a logic circuit diagram of a bit line decoder 230' and a redundant bit line decoder 240' according to the present invention. The bit line decoder 230' comprises M+1 sub-decoders $231\text{-}_1'$ to $231\text{-}_{M+1}'$, and each bit line sub-decoder 231' corresponds to a bit line BL' in the main memory array region 260. Except for the bit line sub-decoders $231\text{-}_1'$ and $231\text{-}_{M+1}'$, each bit line sub-decoder $231\text{-}_2'$ to $231\text{-}_M'$ comprises two three-input NAND gates used for receiving an address signal, a two-input NAND gate whose two inputs are electrically connected to two outputs of the three-input NAND gates, and an inverter whose input is electrically connected to an output of the two-input NAND gate. The bit line sub-decoder $231\text{-}_{M+1}'$ corresponding to the bit line $BL_{M+1}'$ comprises a three-input NAND gate 232 used for receiving an address signal, a two-input NAND gate 233, and an inverter 234. One input of the two-input NAND gate 233 is electrically connected to an output of the three-input NAND gate 232, and another input is electrically connected to a signal pass line 236'. An input of the inverter 234 is electrically connected to an output of the two-input NAND gate 233.

The redundant bit line decoder 240' comprises N+1 redundant bit line sub-decoders $241\text{-}_1'$ to $241\text{-}_{N+1}'$, and each redundant bit line sub-decoder 241' corresponds to a bit line RBL' in the redundant memory array region 270. Except for the redundant bit line sub-decoders $241\text{-}_1'$ and $241\text{-}_{N+1}'$, each redundant bit line sub-decoder $241\text{-}_2'$ to $241\text{-}_M'$ comprises two four-input NAND gates used for receiving an address signal and a corresponding signal, a two-input NAND gate whose two inputs are electrically connected to two outputs of the four-input NAND gates, and an inverter. The redundant bit line sub-decoder $241\text{-}_1'$ corresponding to the bit line $RBL_1'$ comprises a four-input NAND gate 242 used for receiving an address signal and a corresponding signal, a two-input NAND gate 243, and an inverter 244. One input of the two-input NAND gate 243 is electrically connected to an output of the four-input NAND gate 242, and another input is electrically connected to a signal pass line 238'. An input of the inverter 244 is electrically connected to an output of the two-input NAND gate 243.

Two ends of the signal pass line 236' are electrically connected to an input of the two-input NAND gate 233 of the bit line sub-decoder $231\text{-}_{M+1}'$ and an output of the four-input NAND gate 242 of the redundant bit line sub-decoder $241\text{-}_1'$, respectively. Two ends of the signal pass line 238' are electrically connected to an input of the two-input NAND gate 243 of the redundant bit line sub-decoder $241\text{-}_1'$ an output of the three-input NAND gate 232 of the bit line sub-decoder $231\text{-}_{M+1}'$, respectively.

When the non-volatile memory 210 is operated, the address buffer 222 passes an address signal to the bit line decoder 230' and the addressable memory unit 224, respectively. The bit line decoder 230' decodes the address signal to select an appropriate bit line BL' in the main memory array region 260. When the address signal passed corresponds to an address stored in the addressable memory unit 224, the addressable memory unit 224 generates a corresponding signal to turn on the redundant bit line decoder 240'. The redundant bit line decoder 240' decodes the address signal and the signal in the signal pass line 236' to select an appropriate redundant bit line RBL' in the redundant memory array region 270.

When the bit line decoder 230' attempts to turn on the common bit line $BL_C'$, the output $BL_{M+1}'$ of the bit line sub-decoder $231\text{-}_{M+1}'$ is selected, and the signal pass line 238' of the bit line sub-decoder $231\text{-}_{M+1}'$ passes an interacting signal to the redundant bit line sub-decoder $241\text{-}_1'$ to also select the output $RBL_1'$ of the redundant bit line sub-decoder $241\text{-}_1'$. That is to say, both the sub-decoders $231\text{-}_{M+1}'$ and $241\text{-}_1'$ are selected (i.e. both sub-decoders generate an equal potential output). Likewise, when the redundant bit line decoder 240' attempts to turn on the common bit line $BL_C'$, the output $RBL_1'$ of the redundant bit line sub-decoder $241\text{-}_1'$ is selected, and the signal pass line 236' of the redundant bit line sub-decoder $241\text{-}_1'$ passes an interacting signal to the bit line sub-decoder $231\text{-}_{M+1}'$ to also select the output $BL_{M+1}'$ of the bit line sub-decoder $231\text{-}_{M+1}'$. That is to say, both the sub-decoders $231\text{-}_{M+1}'$ and $241\text{-}_1'$ are selected (i.e. both sub-decoders generate an equal potential output).

Figure 10B:
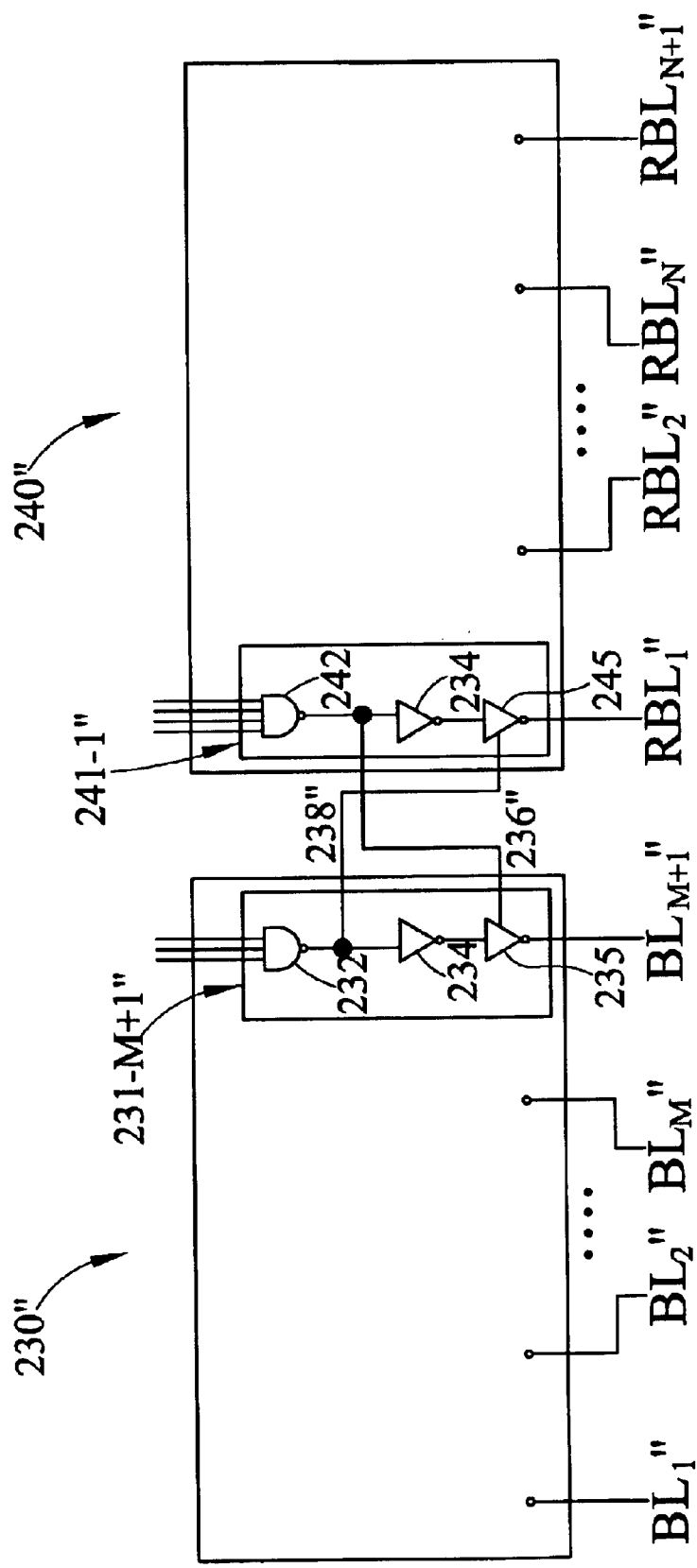
FIG. 10B is a logic circuit diagram of a bit line decoder and a redundant bit line decoder according to another preferred embodiment of the present invention.

Please refer to FIG. 10B. FIG. 10B is a logic circuit diagram of a bit line decoder 230" and a redundant bit line decoder 240" according to another preferred embodiment of the present invention. A bit line sub-decoder $231\text{-}_{M+1}"$ corresponding to a bit line $BL_{M+1}"$ comprises a three-input NAND gate, an inverter 234, and a tri-state inverter 235. A control end of the tri-state inverter 235 is electrically connected to a signal pass line 236". The redundant bit line sub-decoder $241\text{-}_1"$ corresponding to a bit line $RBL_1"$ comprises a four-input NAND gate 242 used for receiving an address signal and a corresponding signal, an inverter 244, and a tri-state inverter 245. A control end of the inverter 245 is electrically connected to a signal pass line 238".

As the operation procedure illustrated in FIG. 6B, the embodiment disclosed in FIG. 10B shows that when the non-volatile memory 210 is operated, the address buffer 222 passes an address signal to the bit line decoder 230" and the addressable memory unit 224, respectively. The bit line decoder 230" decodes the corresponding signal and the address signal to select an appropriate bit line BL" in the main memory array region 260. When the address signal passed corresponds to an address stored in the addressable memory unit 224, the addressable memory unit 224 generates a corresponding signal to turn on the redundant bit line decoder 240". The redundant bit line decoder 240" decodes the signal passed from the addressable memory unit 224 to select an appropriate bit line RBL" in the redundant memory array region 270.

In the two embodiments mentioned in FIG. 10A and FIG. 10B, the present invention utilizes the bit line decoder 230'/230" and the redundant bit line decoder 240'/240" to make the main memory array region 260 directly connect to the redundant memory array region 270. That is to say, the main memory array region 260 and the redundant memory array region 270 share a drain, form a common bit line, and correctly apply each potential to the common bit line. The interactive signal passed from the signal pass line 238'/238" of the bit line decoder 230'/230" is used to control the redundant bit line decoder 240'/240", and the interactive signal passed from the signal pass line 236'/236" of the redundant bit line decoder 240'/240" is used to control the bit line decoder 230'/230", In contrast to the conventional non-volatile memory, which wastes layout area on a field oxide and dummy memories positioned between the main memory array region and the redundant memory array region, the present invention directly connects the main memory array region and the redundant memory array region by utilizing a main memory decoder and a redundant memory decoder. The field oxide and dummy memories commonly present in prior art non-volatile memories has been eliminated to reduce the layout area of the memory array region. Additionally, the non-volatile memory according to the present invention comprises a virtual ground array structure.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A non-volatile memory positioned on a substrate of a semiconductor wafer, the non-volatile memory comprising:
   a main memory array region comprising:
      at least one main memory cell, the main memory cell comprising a main source and a main drain positioned in the substrate of the semiconductor wafer;
      at least one main bit line, the main bit line being electrically connected to the main drain of the main memory cell; and
      at least one main ground line, the main ground line being electrically connected to the main source of the main memory cell;
   a redundant memory array region connected to the main memory array region, the redundant memory array region comprising:
      at least one redundant memory cell, the redundant memory cell comprising a redundant source and a redundant drain positioned in the substrate of the semiconductor wafer;
      at least one redundant bit line, the redundant bit line being electrically connected to the redundant drain of the redundant memory cell; and
      at least one redundant ground line, the redundant ground line being electrically connected to the redundant source of the redundant memory cell; and
   a common source used as the main source and the redundant source formed between the main memory array region and the redundant memory array region.

2. The non-volatile memory of claim 1 further comprising a peripheral circuit region having:
   a main memory ground line decoder electrically connected to the main ground lines in the main memory array region;
   a redundant memory ground line decoder electrically connected to the redundant ground lines in the redundant memory array region; and
   at least two signal pass lines, two ends of each of the signal pass lines being electrically connected to the main memory ground line decoder and the redundant memory ground line decoder, respectively.

3. The non-volatile memory of claim 2 wherein the common source is electrically connected to a common ground line, and when the main memory ground line decoder addresses the common ground line, the main memory ground line decoder passes a signal to the redundant memory ground line decoder through the signal pass line to determine a potential of the common ground line and to generate an open-circuit between the common ground line and the redundant memory ground line decoder, and when the redundant memory ground line decoder addresses the common ground line, the redundant memory ground line decoder passes a signal to the main memory ground line decoder through the other signal pass line to determine a potential of the common ground line and to generate an open-circuit between the common ground line and the main memory ground line decoder.

4. The non-volatile memory of claim 3 wherein a sub-decoder of the main memory ground line decoder is electrically connected to the common ground line and comprises a three-input NAND gate having three inputs for receiving an address signal, a first inverter having a first input electrically connected to an output of the three-input NAND gate, and a first tri-state inverter having a control end electrically connected to an output of a four-input NAND gate, the four-input NAND gate having four inputs and being formed in a sub-decoder of the redundant memory ground line decoder for receiving an address signal and a corresponding signal, the sub-decoder of the redundant memory ground line decoder being electrically connected to the common ground line and further comprising a second inverter and a second tri-state inverter, an input of the second inverter being electrically connected to an output of the four-input NAND gate, a control end of the second tri-state inverter being electrically connected to an output of the three-input NAND gate.

5. The non-volatile memory of claim 2 wherein the common source is electrically connected to a common ground line, and when the main memory ground line decoder addresses the common ground line, the main memory ground line decoder passes a signal to the redundant memory ground line decoder through the signal pass line so as to select the sub-decoders connected to the common ground line and cause the selected sub-decoders to generate an equal-potential output, and when the redundant memory ground line decoder addresses the common ground line, the redundant memory ground line decoder passes a signal to the main memory ground line decoder through the signal pass line to select the sub-decoders electrically connected to the common ground line and generate an equal-potential output.

6. The non-volatile memory of claim 5 wherein a sub-decoder of the main memory ground line decoder is electrically connected to the common ground line and comprises a three-input NAND gate having three inputs for receiving an address signal, a first NAND gate having an input electrically connected to an output of the three-input NAND gate and the other input electrically connected to an output of a four-input NAND gate, and a first inverter, the four-input NAND gate having four inputs and being formed in a sub-decoder of the redundant memory ground line decoder for receiving an address signal and a corresponding signal, the sub-decoder of the redundant memory ground line decoder being electrically connected to the common ground line and further comprising a second two-input NAND gate and a second inverter, an input of the second two-input NAND gate being electrically connected to an output of the four-input NAND gate, the other input of the second two-input NAND gate being electrically connected to an output of the three-input NAND gate in a sub-decoder of the main memory ground line decoder.

7. The non-volatile memory of claim 1 wherein the non-volatile memory has a virtual ground array structure.

8. A non-volatile memory positioned on a substrate of a semiconductor wafer, the non-volatile memory comprising:
   a main memory array region comprising:
      at least one main memory cell, the main memory cell comprising a main source and a main drain positioned in the substrate of the semiconductor wafer;
      at least one main bit line, the main bit line being electrically connected to the main drain of the main memory cell; and at least one main ground line, the main ground line being electrically connected to the main source of the main memory cell;

a redundant memory array region connected to the main memory array region, the redundant memory array region comprising:
  at least one redundant memory cell, the redundant memory cell comprising a redundant source and a redundant drain positioned in the substrate of the semiconductor wafer;
  at least one redundant bit line, the redundant bit line being electrically connected to the redundant drain of the redundant memory cell; and
  at least one redundant ground line, the redundant ground line being electrically connected to the redundant source of the redundant memory cell; and a common drain used as the main drain and the redundant drain formed between the main memory array region and the redundant memory array region.

9. The non-volatile memory of claim 8 further comprising a peripheral circuit region having:
  a main memory bit line decoder electrically connected to the main bit lines in the main memory array region;
  a redundant memory bit line decoder electrically connected to the redundant bit lines in the redundant memory array region; and
  at least two signal pass lines, two ends of each of the signal pass lines being electrically connected to the main memory bit line decoder and the redundant memory bit line decoder, respectively.

10. The non-volatile memory of claim 9 wherein the common drain is electrically connected to a common bit line, and when the main memory bit line decoder addresses the common bit line, the main memory bit line decoder passes a signal to the redundant memory bit line decoder through the signal pass line to determine a potential of the common bit line and to generate an open-circuit between the common bit line and the redundant memory bit line decoder, and when the redundant memory bit line decoder addresses the common bit line, the redundant memory bit line decoder passes a signal to the main memory bit line decoder through the other signal pass line to determine a potential of the common bit line and to generate an open-circuit between the common bit line and the main memory bit line decoder.

11. The non-volatile memory of claim 10 wherein a sub-decoder of the main memory bit line decoder is electrically connected to the common bit line and comprises a three-input NAND gate having three inputs for receiving an address signal, a first inverter having an input electrically connected to an output of the three-input NAND gate, and a first tri-state inverter having a control end electrically connected to an output of a four-input NAND gate, the four-input NAND gate having four inputs and being formed in a sub-decoder of the redundant memory bit line decoder for receiving an address signal and a corresponding signal, the sub-decoder of the redundant memory bit line decoder being electrically connected to the common bit line and further comprising a second inverter and a second tri-state inverter, an input of the second inverter being electrically connected to an output of the four-input NAND gate, an input of the second tri-state inverter being electrically connected to an output of the three-input NAND gate in a sub-decoder of the main memory bit line decoder.

12. The non-volatile memory of claim 9 wherein the common drain is electrically connected to a common bit line, and when the main memory bit line decoder addresses the common bit line, the main memory bit line decoder passes a signal to the redundant memory bit line decoder through the signal pass line so as to select the sub-decoders electrically connected to the common bit line and generate an equal-potential output, and when the redundant memory bit line decoder addresses the common bit line, the redundant memory bit line decoder passes a signal to the main memory bit line decoder through the signal pass line to select the sub-decoders electrically connected to the common bit line and generate an equal-potential output.

13. The non-volatile memory of claim 12 wherein the sub-decoder of the main memory bit line decoder is electrically connected to the common bit line and comprises a three-input NAND gate having three inputs for receiving an address signal, a first NAND gate having an input electrically connected to an output of the three-input NAND gate and the other input electrically connected to an output of a four-input NAND gate, and a first inverter, the four-input HAND gate having four inputs and being formed in a sub-decoder of the redundant memory bit line decoder for receiving an address signal and a corresponding signal, the sub-decoder of the redundant memory bit line decoder being electrically connected to the common bit line and further comprising a second two-input HAND gate and a second inverter, an input of the second two-input NAND gate being electrically connected to an output of the four-input NAND gate, the other input of the second two-input NAND gate being electrically connected to an output of the three-input NAND gate in a sub-decoder of the main memory bit line decoder.

14. The non-volatile memory of claim 8 wherein the non-volatile memory has a virtual ground array structure.

15. A non-volatile memory positioned on a substrate of a semiconductor wafer, the non-volatile memory comprising:
  a main memory array region comprising:
    at least one main memory cell, the main memory cell comprising a main source and a main drain positioned in the substrate of the semiconductor wafer;
    at least one main bit line, the main bit line being electrically connected to the main drain of the main memory cell; and
    at least one main ground line, the main ground line being electrically connected to the main source of the main memory cell;
  a redundant memory array region connected to the main memory array region, the redundant memory array region comprising:
    at least one redundant memory cell, the redundant memory cell comprising a redundant source and a redundant drain positioned in the substrate of the semiconductor wafer;
    at least one redundant bit line, the redundant bit line being electrically connected to the redundant drain of the redundant memory cell; and
    at least one redundant ground line, the redundant ground line being electrically connected to the redundant source of the redundant memory cell, wherein a common doped region is commonly used by the main memory array region and the redundant memory array region; and
  a peripheral circuit region comprising at least one decoder.

16. The non-volatile memory of claim 15 wherein the decoder comprises:
- a main memory ground line decoder electrically connected to the main ground lines in the main memory array region;
- a redundant memory ground line decoder electrically connected to the redundant ground lines in the redundant memory array region; and
- at least two signal pass lines, two ends of each of the signal pass lines being electrically connected to the main memory ground line decoder and the redundant memory ground line decoder, respectively.

17. The non-volatile memory of claim 16 wherein the decoder further comprises a common ground line decoder.

18. The non-volatile memory of claim 15 wherein the common doped region is used as the main source and the redundant source formed between the main memory array region and the redundant memory array region.

19. The non-volatile memory of claim 15 wherein the decoder comprises:
- a main memory bit line decoder electrically connected to the main bit lines in the main memory array region;
- a redundant memory bit line decoder electrically connected to the redundant bit lines in the redundant memory array region; and
- at least two signal pass lines, two ends of each of the signal pass lines being electrically connected to the main memory bit line decoder and the redundant memory bit line decoder, respectively.

20. The non-volatile memory of claim 19 wherein the decoder further comprises a common bit line decoder.

21. The non-volatile memory of claim 15 wherein the common doped region is used as the main drain and the redundant drain formed between the main memory array region and the redundant memory array region.

* * * * *